United States Patent
Lin et al.

(10) Patent No.: US 7,911,028 B2
(45) Date of Patent: Mar. 22, 2011

(54) SEMICONDUCTOR DEVICE AND METHOD OF MANUFACTURING THE SAME

(75) Inventors: Shian-Jyh Lin, Taipei County (TW); Chih-Wei Huang, Taoyuan (TW); Chao-Sung Lai, Tao-Yuan (TW); Hsing-Kan Peng, Hsinchu County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 5 days.

(21) Appl. No.: 12/183,077

(22) Filed: Jul. 31, 2008

(65) Prior Publication Data
US 2010/0025815 A1 Feb. 4, 2010

(51) Int. Cl.
H01L 29/94 (2006.01)

(52) U.S. Cl. .......... 257/532; 257/68; 257/71; 257/296; 257/300; 257/301; 257/E21.008; 257/E27.016; 257/E27.048; 257/E27.071; 257/E27.092; 257/E27.093; 438/171; 438/190; 438/210; 438/238; 438/239; 438/243; 438/250; 438/386; 438/393

(58) Field of Classification Search ............ 257/68, 257/71, 311, 516, 532, E27.092, E27.093, 257/E21.008
See application file for complete search history.

(56) References Cited

U.S. PATENT DOCUMENTS

| | | | | |
|---|---|---|---|---|
| 5,187,557 A | * | 2/1993 | Zenke | 257/310 |
| 5,930,584 A | * | 7/1999 | Sun et al. | 438/3 |
| 2004/0070017 A1 | * | 4/2004 | Yang et al. | 257/296 |
| 2004/0152255 A1 | * | 8/2004 | Seidl et al. | 438/240 |
| 2008/0111167 A1 | * | 5/2008 | Yamaguchi | 257/288 |
| 2009/0200618 A1 | * | 8/2009 | Boescke et al. | 257/407 |

OTHER PUBLICATIONS

Characterizations of HfxMoyNz Alloys as Gate Electrodes for n- and p-Channel Metal Oxide Semiconductor Field Effect Transistors; Japanese. Journal of Appl. Phys. vol. 47 (2008) pp. 2442-2445 Chao Sung Lai, Hsing Kan Peng, Chin Wei Huang, Kung Ming Fan, Yu Ching Fang1, Li Hsu1, Hui Chun Wang1, Chung Yuan Lee2, and Shian Jyh Lin2.*

* cited by examiner

*Primary Examiner* — Benjamin P Sandvik
*Assistant Examiner* — Farid Khan
(74) *Attorney, Agent, or Firm* — Winston Hsu; Scott Margo

(57) ABSTRACT

A semiconductor device including a metallic compound $Hf_{x1}Mo_{y1}N_{z1}$ as an electrode. The work function of the electrode can be modulated by doping the metallic compound with dopants including nitrogen, silicon or germanium. The metallic compound of the present invention is applicable to PMOS, NMOS, CMOS transistors and capacitors.

20 Claims, 18 Drawing Sheets

SEMICONDUCTOR DEVICE AND METHOD OF MANUFACTURING THE SAME

BACKGROUND OF THE INVENTION

1. Field of the Invention

The present invention relates to a semiconductor structure and a method for forming the same. More particularly, the present invention relates to a semiconductor with an $Hf_x\text{-}Mo_yN_z$ layer serving as the electrode.

2. Description of the Prior Art

Complementary metal-oxide-semiconductors (CMOS) are a major class of integrated circuits. According to the polarity of the CMOS channel, the CMOS can be divided into P-type and N-Type, i.e. PMOS and NMOS. CMOS technology is used in chips such as microprocessors, microcontrollers, static RAM, and other digital logic circuits. In addition, a CMOS consumes power only during its switching on or off time. Therefore power is saved and heat generation is reduced during the operation of the CMOS.

Functionally speaking, PMOS and NMOS each have different threshold voltages, which are determined by the difference of the work function of the gate and the channel material.

When using the metal gate in the CMOS fabrication, the Fermi level of the metal gate is preferably at the midpoint of the silicon. In this way, the threshold voltage of the PMOS and CMOS can be easily adjusted to meet the requirement. In general, the threshold voltage PMOS and CMOS are adjusted by utilizing two different metals as the gate materials.

Because two layers of different metals are required to form the gate material, the two layers are formed separately. For example: a first gate electrode material layer is entirely formed on a substrate, then a selective etching is performed based on a well defined patterned hard mask, a second gate electrode material layer fills the space defined by the selective etching, and finally the surfaces of the first gate electrode material layer and the second gate electrode material layer are planarized to complete the fabrication.

Another example of fabricating the gate with two layers of different metals is described herein: a sacrificial layer is entirely formed on a substrate top face, later, the sacrificial layer is selectively removed to allow a first gate electrode material to fill in gaps defined by the removal of the sacrificial layer, and then the sacrificial layer is completely removed to allow a second gate electrode material layer to fill in gaps from the removal of the sacrificial layer to complete the fabrication.

No matter which method is used, a selective etching must be performed to form different metal layers for respectively deciding the threshold voltages of the PMOS and NMOS. It is clear that the concept of first forming the first gate electrode material layer followed by an etching process to form the second gate electrode is both complex and troublesome and does not meet the demand of simplicity pursued by the industry. Therefore, a novel material is needed to form gates with different work function.

Capacitors are widely used in the semiconductor industry, especially as data-storage elements in DRAMs. A capacitor includes a top electrode, a bottom electrode and a dielectric layer. The top electrode and bottom electrode can be made of tungsten (W), aluminum (Al), titanium (Ti), and ruthenium (Ru), etc. In order to scale down the element size, the dielectric layer is usually made of a high-k material such as hafnium silicon oxynitride (HfSiON), or titanium oxides ($TiO_2$). Because of the material heterogeneity, a bad affinity exists between the dielectric layer and the electrode. Therefore, a peeling problem will occur between the dielectric layer and the electrode during the fabricating process. Accordingly, a novel material is in need to solve the material heterogeneity between the dielectric layer and the electrode.

SUMMARY OF THE INVENTION

According to a preferred embodiment of the present invention, a method of forming a semiconductor device comprises the steps of: providing a substrate having a first dielectric layer on top of the substrate surface. Then, a metallic compound is formed on the first dielectric layer, wherein the metallic compound comprises at least hafnium, molybdenum and nitrogen. Next, a second dielectric layer is formed on top of the metallic compound. After that, the second dielectric layer, the metallic compound and the first dielectric layer are patterned to form a gate structure on the substrate. Finally, a source/drain doping region is formed in the substrate at a side of the gate structure.

According to another preferred embodiment of the present invention, a method of forming a semiconductor device comprises steps of: first, providing a substrate having a first dielectric layer on top of the substrate surface. Next, a metallic compound is formed on the first dielectric layer, wherein the metallic compound comprises hafnium, molybdenum and nitrogen. Then, the metallic compound is doped. After that, a second dielectric layer is formed on top of the metallic compound. Latter, the second dielectric layer, the metallic compound and the first dielectric layer are patterned to form a gate structure on the substrate. Finally, a source/drain doping region is formed in the substrate at a side of the gate structure.

According to another preferred embodiment of the present invention, a semiconductor device comprises: a substrate, a gate structure positioned on the substrate, wherein the gate structure comprises: a gate dielectric layer formed on the surface of the substrate and a metallic compound formed on the gate dielectric layer, wherein the metallic compound at least comprises hafnium, molybdenum and nitrogen. The transistor structure further comprises a source/drain doping region formed in the substrate and adjacent to the gate structure.

The present invention provides a capacitor structure, including a bottom electrode comprising a conductive material, a capacitor dielectric layer positioned on the bottom electrode and a top electrode positioned on the capacitor dielectric layer, wherein the top electrode comprises a first metallic compound of a representative formula $Hf_{x1}Mo_{y1}N_{z1}$, wherein $x_1+y_1+z_1=1$, $x_1\neq0$, $y_1\neq0$, $z_1\neq0$.

The present invention provides another capacitor structure including a substrate, a deep trench positioned in the substrate, wherein the deep trench is filled up with a metallic compound of a representative formula $Hf_{x1}Mo_{y1}N_{z1}$ wherein $x_1+y_1+z_1=1$, $x_1\neq0$, $y_1\neq0$, $z_1\neq0$ and a capacitor dielectric layer positioned between the substrate and the metallic compound.

The present invention further provides a method of forming a capacitor structure, including: providing a substrate. After that, a first metallic compound is formed on the substrate, wherein the first metallic compound is $Hf_xMo_yN_z$, and $x+y+z=1$, $x\neq0$, $y\neq0$, $z\neq0$. Then, a capacitor dielectric layer is formed on the first metallic compound. Next, a second metallic compound is formed on the capacitor dielectric layer, wherein the second metallic compound is $Hf_{x1}Mo_{y1}N_{z1}$, and $x_1+y_1+z_1=1$, $x_1\neq0$, $y_1\neq0$, $z_1\neq0$. Finally, the pattern of the first metallic compound, the capacitor dielectric layer and the second metallic compound are defined to form the capacitor structure.

These and other objectives of the present invention will no doubt become obvious to those of ordinary skill in the art after reading the following detailed description of the preferred embodiment that is illustrated in the various figures and drawings.

DETAILED DESCRIPTION

FIG. 1 to FIG. 6 depict a method of making a semiconductor device according to a first embodiment of the present invention.

Figure 1:
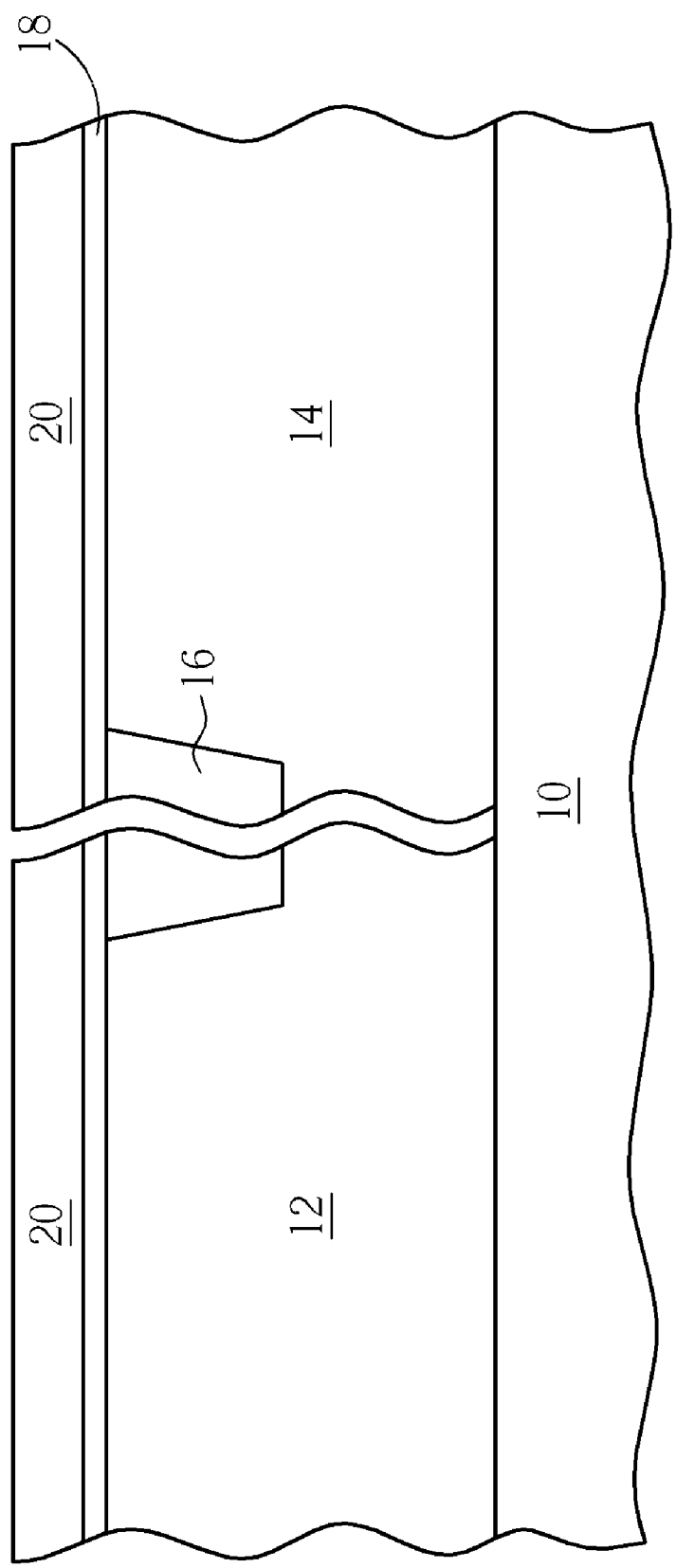
FIG. 1 to FIG. 6 depict a method of making a semiconductor device according to a first embodiment of the present invention.

FIG. 1 shows a substrate 10 comprising a first doping well 12, a second doping well 14 and an STI structure 16 composed of insulating materials. A gate dielectric layer 18 is formed on top of the substrate surface. The substrate 10 may be a P-type substrate, an N-type substrate or a silicon-on-insulator (SOI) substrate. The gate dielectric layer 18 may be composed of oxide, nitride, oxy-nitride or any material having a high dielectric constant. According to a preferred embodiment of the present invention, the gate dielectric layer may be SiN, SiON compounds, HfSiON, $ZrO_2$ or $HfO_2$.

Next, a metallic compound comprising at least hafnium, molybdenum and nitrogen, such as an HfMoN layer 20, is formed on the gate dielectric layer 18, wherein the method of forming the HfMoN layer 20 comprises forming the HfMoN layer 20 in a nitrogen-containing environment by a co-sputtering physical vapor deposition process or a chemical vapor deposition process. According to a preferred embodiment of the present invention, the HfMoN layer 20 is formed by the co-sputtering physical vapor deposition process. By taking the Hf and Mo as targets, the Hf and Mo targets are bombarded by inert gases such as argon with 50~500 W power in a nitrogen-containing environment. In this way, the HfMoN layer 20 can be formed on the surface of the gate dielectric layer 18. In addition, the target can be Hf—Mo alloy, and the HfMoN layer 20 can be formed by a conventional sputtering process. Moreover, the ratio of Mo and Hf can be modulated to make the HfMoN layer 20 have a suitable work function.

Figure 2:
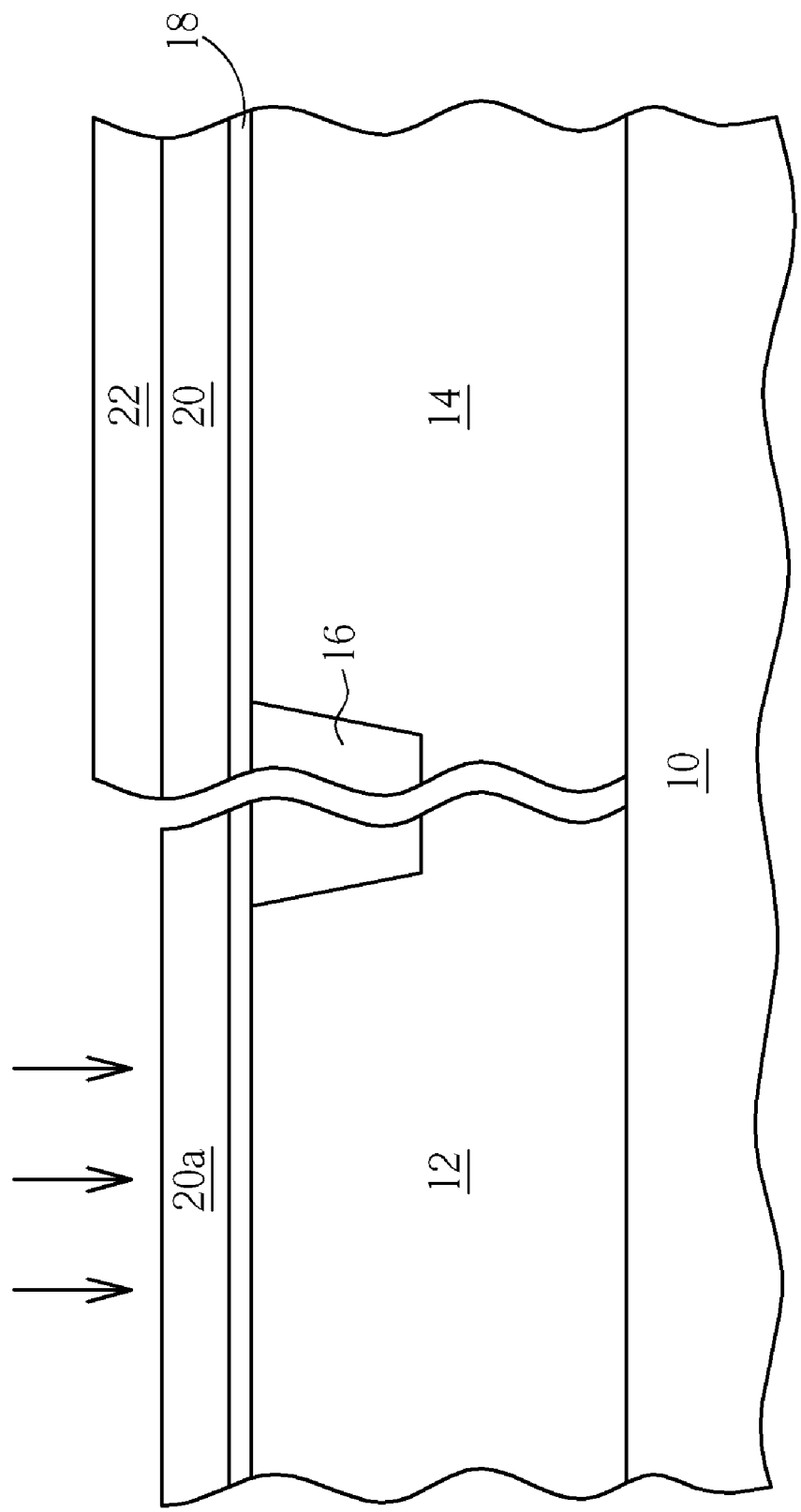

As shown in FIG. 2, the HfMoN layer 20 is covered by a photoresist 22, wherein the HfMoN layer 20 covered by the photoresist 22 is positioned on the second doping well 14. Then, the HfMoN layer 20 positioned on the first doping well 12 is doped in order to modulate the work function of the HfMoN layer 20. Then the HfMoN layer 20 positioned on the first doping well 12 after doping forms an HfMoN layer 20a. The dopant doped in the HfMoN layer 20a can be N, Si, Ge, Mo, Hf or any element which can change the work function. In addition, the method of doping the HfMoN layer 20 is not limited to an ion implantation process, and a diffusion process can be used as well. Furthermore, if the dopant doped in the HfMoN layer 20 is nitrogen, the plasma nitridation process can also be used to dope the HfMoN layer 20. Then the photoresist 22 is removed.

Figure 3:
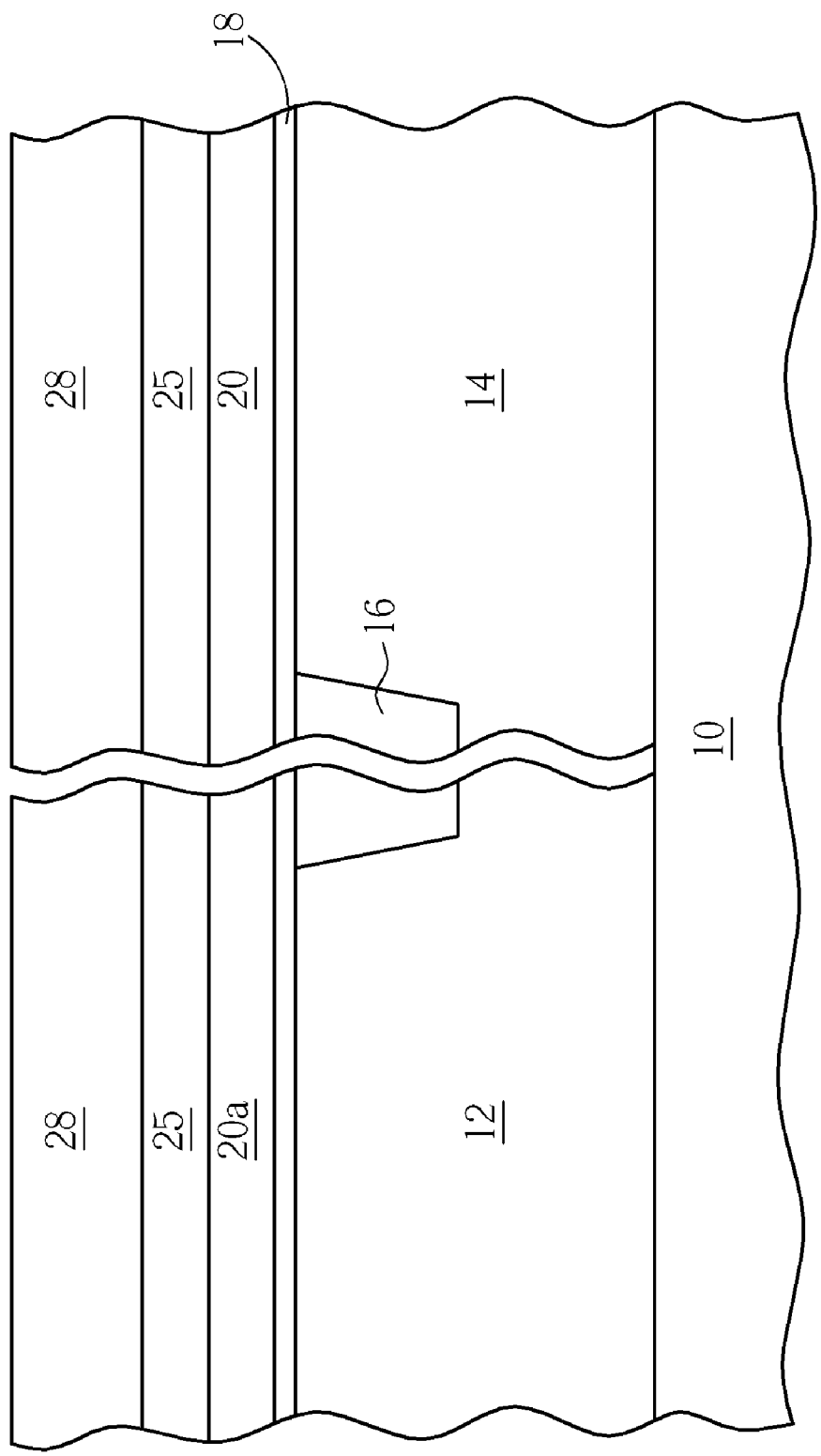

As shown in FIG. 3, a metal layer 25 is formed on the HfMoN layer 20, 20a, wherein the metal layer 25 comprises HfN, MoN, TiN, TaN, WN, W, Al, AlN, Pt, Au or any combination thereof. It is worth noting that the metal layer 25 can be omitted optionally according to different product requirements. Then, a dielectric layer 28 is formed on the metal layer 25, wherein the dielectric layer 28 comprises silicon oxide, silicon nitride or any combination thereof. If the metal layer 25 is omitted, the dielectric layer 28 will be positioned directly on the HfMoN layer 20, 20a.

Figure 4:
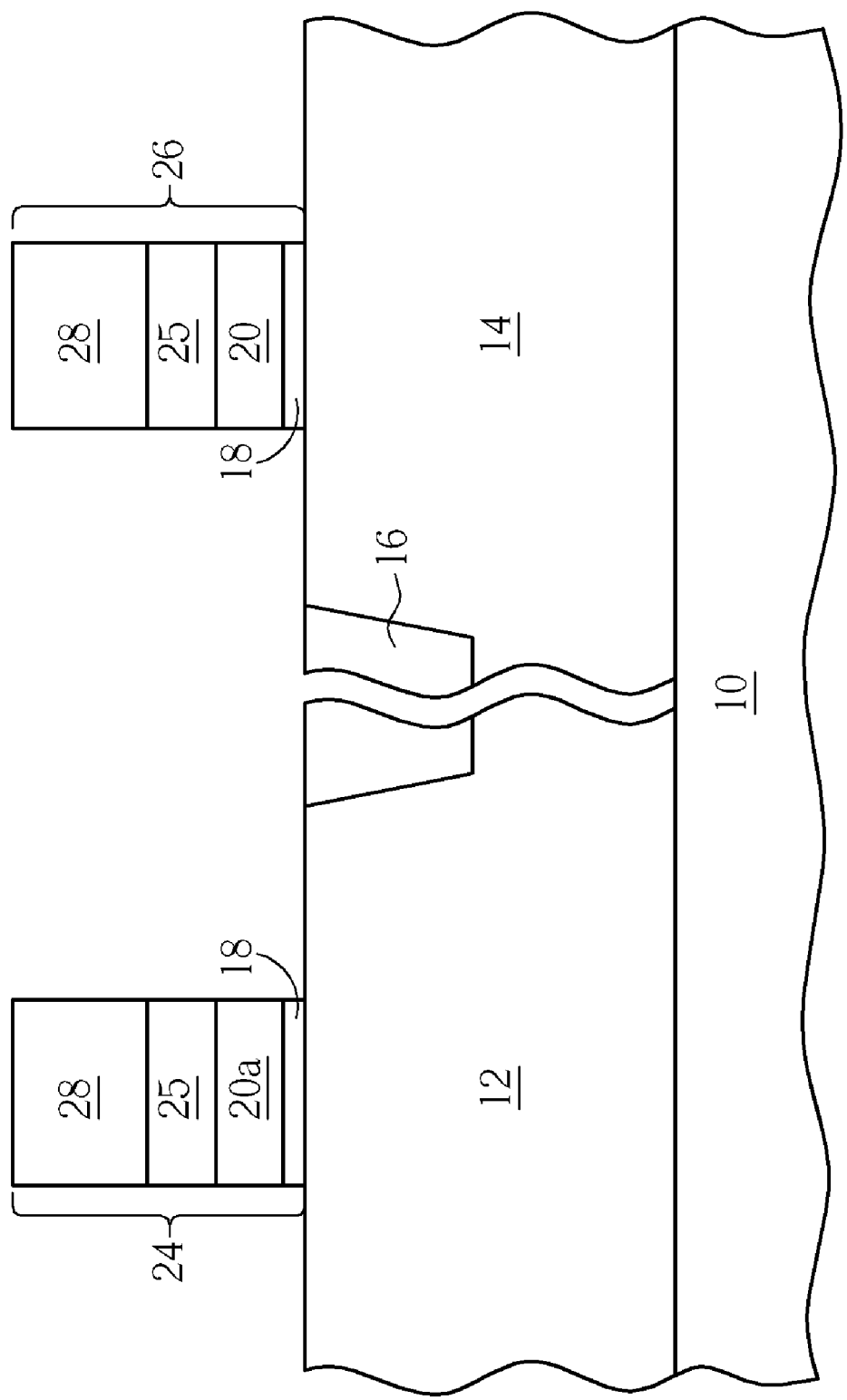

As shown in FIG. 4, a portion of the dielectric layer 28, the metal layer 25, the HfMoN layer 20, 20a and the gate dielectric layer 18 are patterned to form a first transistor gate 24 and a second transistor gate 26.

Figure 5:
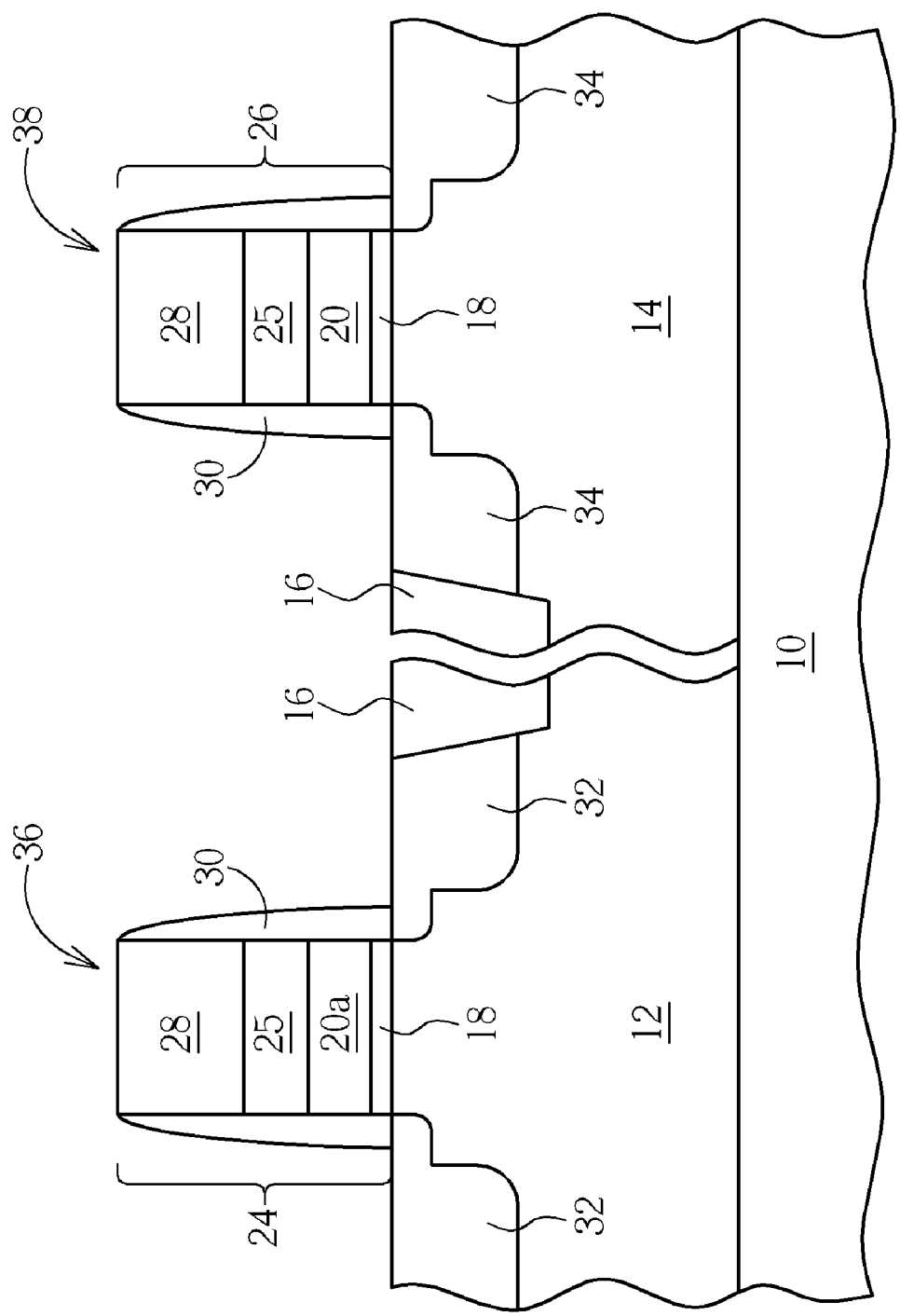

As shown in FIG. 5, a spacer 30 is formed on the sidewall of the first transistor gate 24 and the sidewall of the second transistor gate 26. Then, a first source/drain doping region 32 and a second source/drain doping region 34 are formed in the substrate positioned at two sides of the first transistor gate 24 and the second transistor gate 26, respectively, wherein the first source/drain doping region 32 and the second source/drain doping region 34 may be formed by halo implantation or lightly doped drain (LDD) implantation. At this point, a first transistor 36 and a second transistor 38 are completely formed. According to a preferred embodiment of the present invention, the first transistor 36 may be a PMOS or NMOS and the second transistor 38 may be a PMOS or NMOS.

Figure 6:
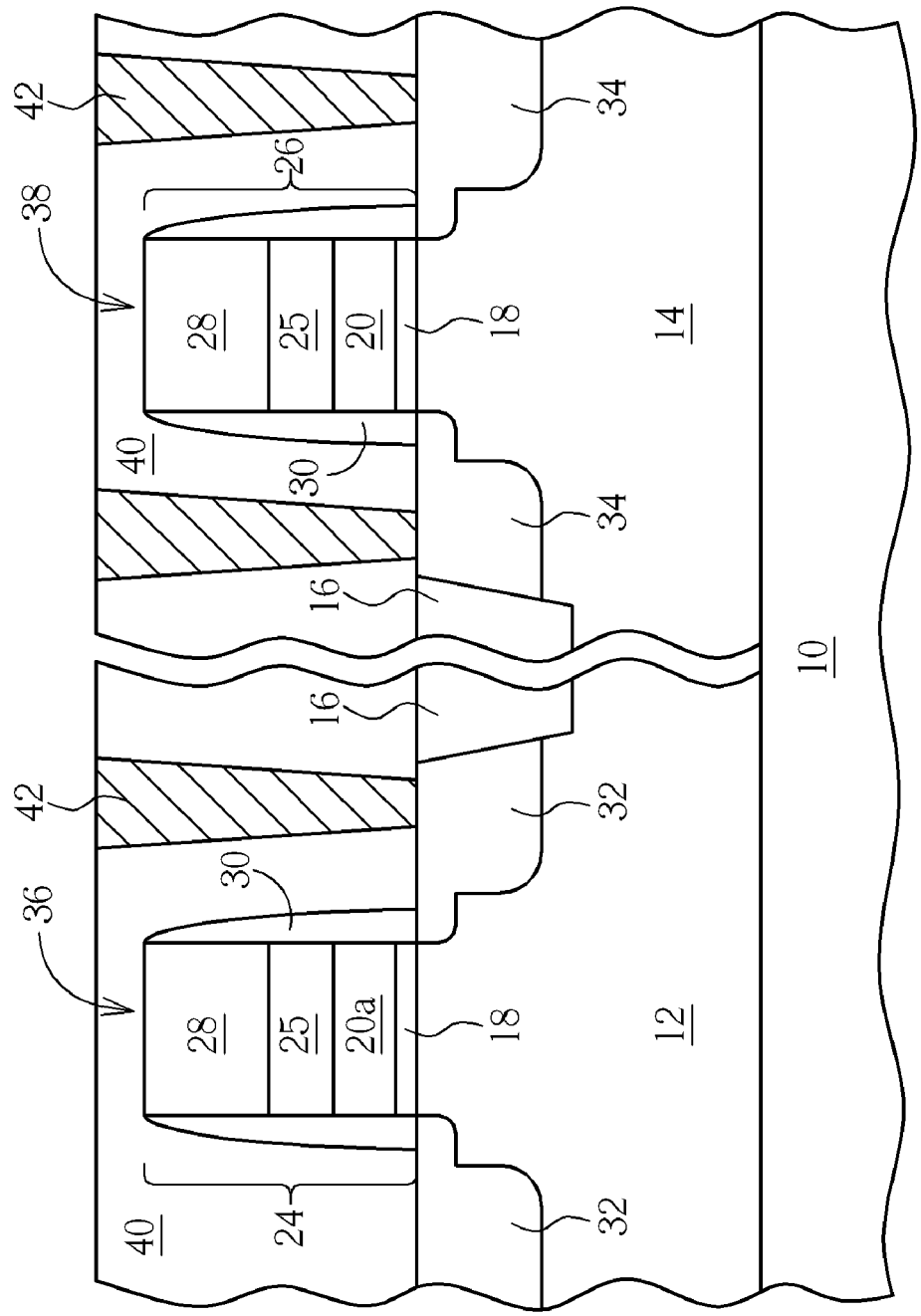

As shown in FIG. 6, an interlayer dielectric layer 40 is formed on the first transistor 36 and the second transistor 38. Next, a plurality of contact holes is formed in the interlayer dielectric layer 40 to partially expose the source/drain doping region 32. Then, a plurality of contact plugs 42 is formed in the contact holes of the interlayer dielectric layer 40 by an etching and deposition process. Contact plugs 40 contact the first source/drain doping region 32 and the second source/drain doping region 34 electrically, wherein the method of forming the contact plugs 40 comprises an atomic layer deposition (ALD) process, a physical vapor deposition process and a chemical vapor deposition process. In addition, contact plugs 40 may be composed of Ti, TiN, W, Cu or any combination thereof.

FIG. 7 to FIG. 13 depict a method of making a semiconductor device according to a second embodiment of the present invention. To simplify the illustration, elements with the same function will use the same numerals as the first embodiment. The main fabricating process of the second embodiment is the same as that of the first embodiment. The difference is that the HfMoN layer 20 positioned on the first doping well 12 and the HfMoN layer 20 positioned on the second doping well 14 are both doped with dopant in the second embodiment of the present invention.

Figure 7:
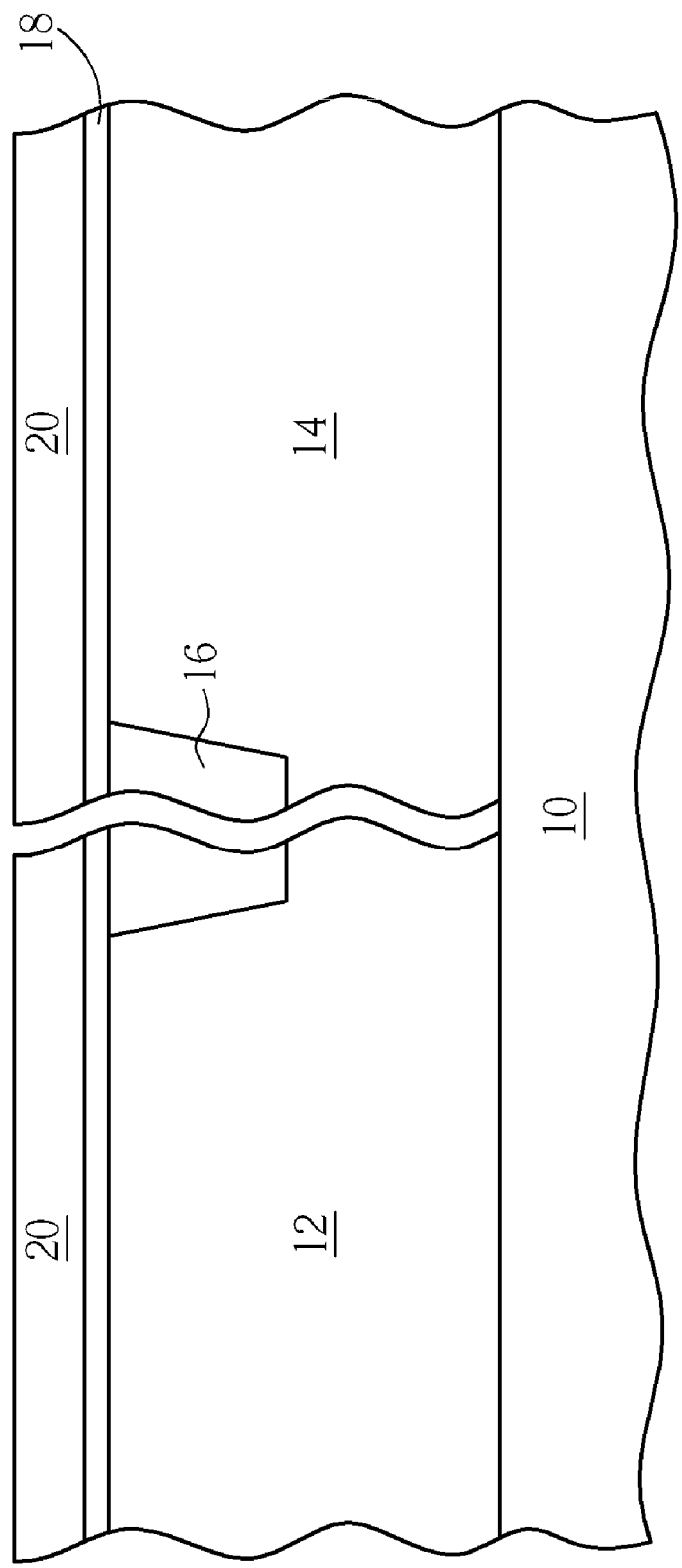
FIG. 7 to FIG. 13 depict a method of making a semiconductor device according to a second embodiment of the present invention.

FIG. 7 shows a substrate 10 comprising a first doping well 12, a second doping well 14 and an STI structure 16 composed of insulating materials. A gate dielectric layer 18 is formed on top of the substrate surface. Next, a metallic compound comprising at least hafnium, molybdenum and nitrogen, such as an HfMoN layer 20, is formed on the gate dielectric layer 18.

Figure 8:
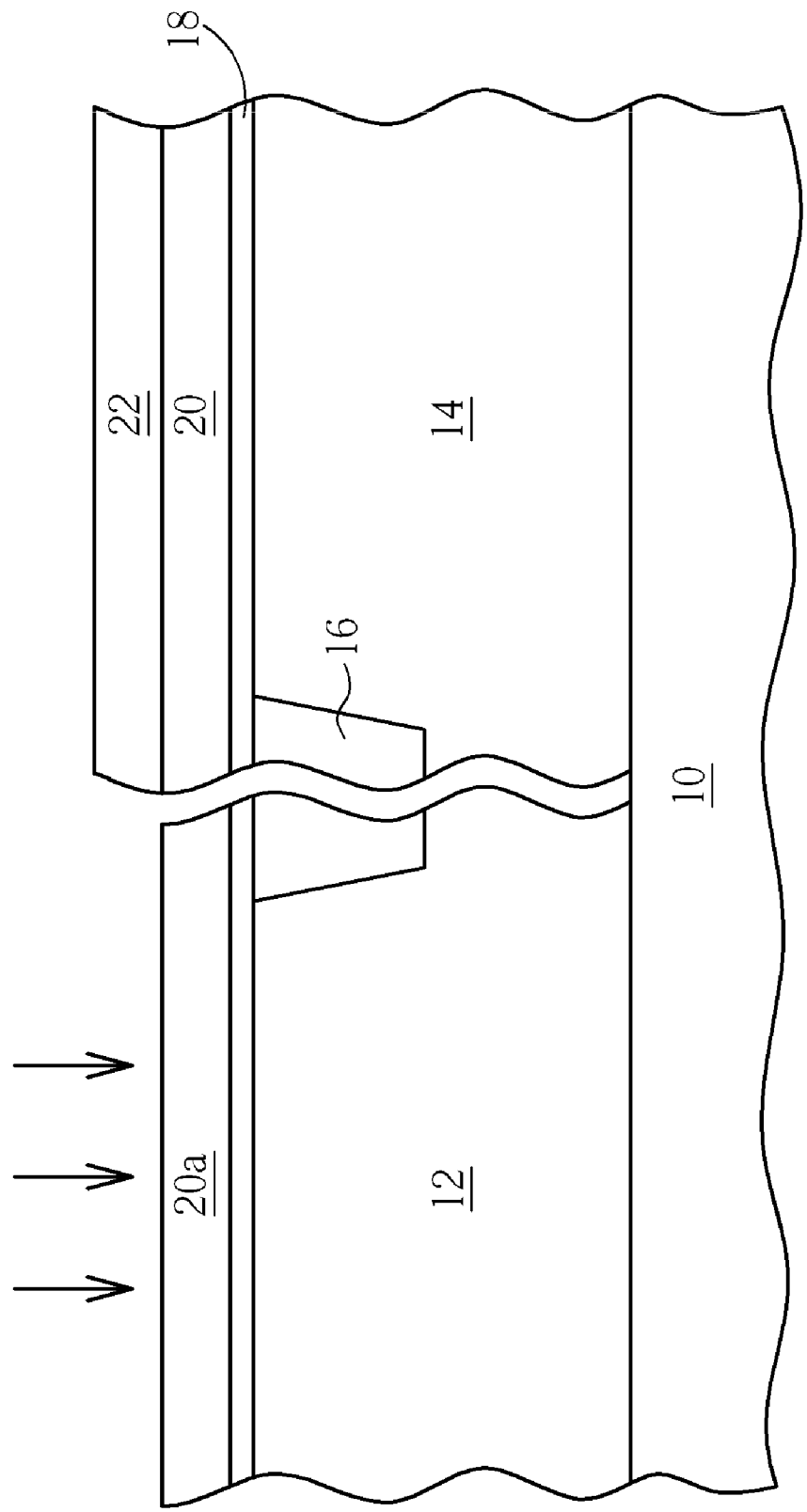

As shown in FIG. 8, a photoresist 22 covers the HfMoN layer 20, wherein the HfMoN layer 20 covered by the photoresist 22 is positioned on the second doping well 14. Then, the HfMoN layer 20 positioned on the first doping well 12 is doped in order to modulate the work function of the HfMoN layer 20. Then the HfMoN layer 20 positioned on the first doping well 12 after doping forms an HfMoN layer 20a. The dopant doped in the HfMoN layer 20a can be N, Si, Ge, Mo, Hf, any combination thereof or any elements which can change the work function. Then the photoresist 22 is removed.

Figure 9:
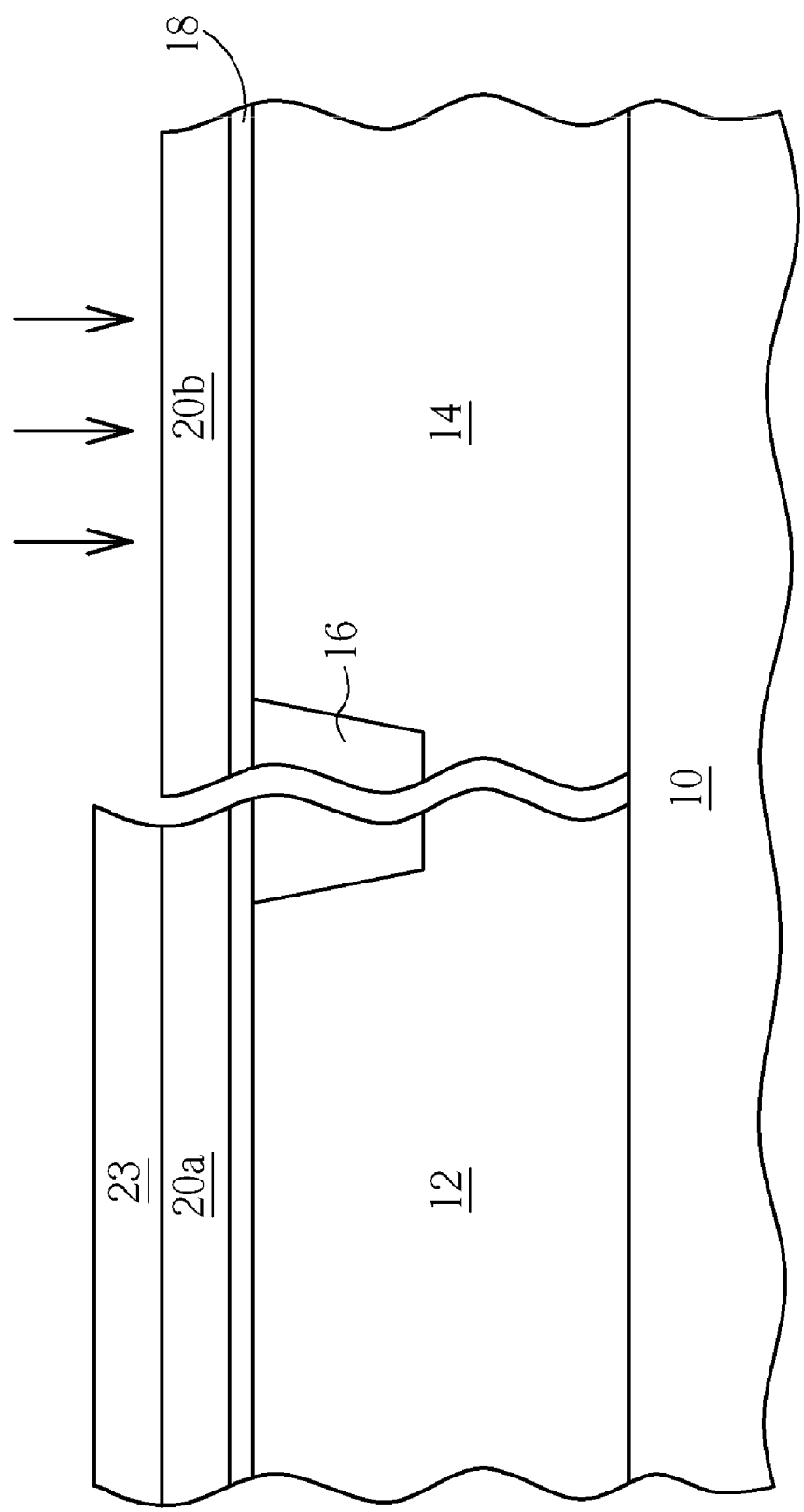

As shown in FIG. 9, a photoresist 23 covers the HfMoN layer 20, wherein the HfMoN layer 20 covered by the photoresist 23 is positioned on the first doping well 12. Then, the HfMoN layer 20 positioned on the second doping well 14 is doped in order to modulate the work function of the HfMoN layer 20 positioned on the second doping well 14. Then the HfMoN layer 20 positioned on the second doping well 14 after doping forms an HfMoN layer 20b. The dopant doped in the HfMoN layer 20a can be N, Si, Ge, any combination thereof or any element which can change the work function. Then the photoresist 23 is removed. The step shown in FIG. 9 is the difference between the first embodiment and the second embodiment.

Figure 10:
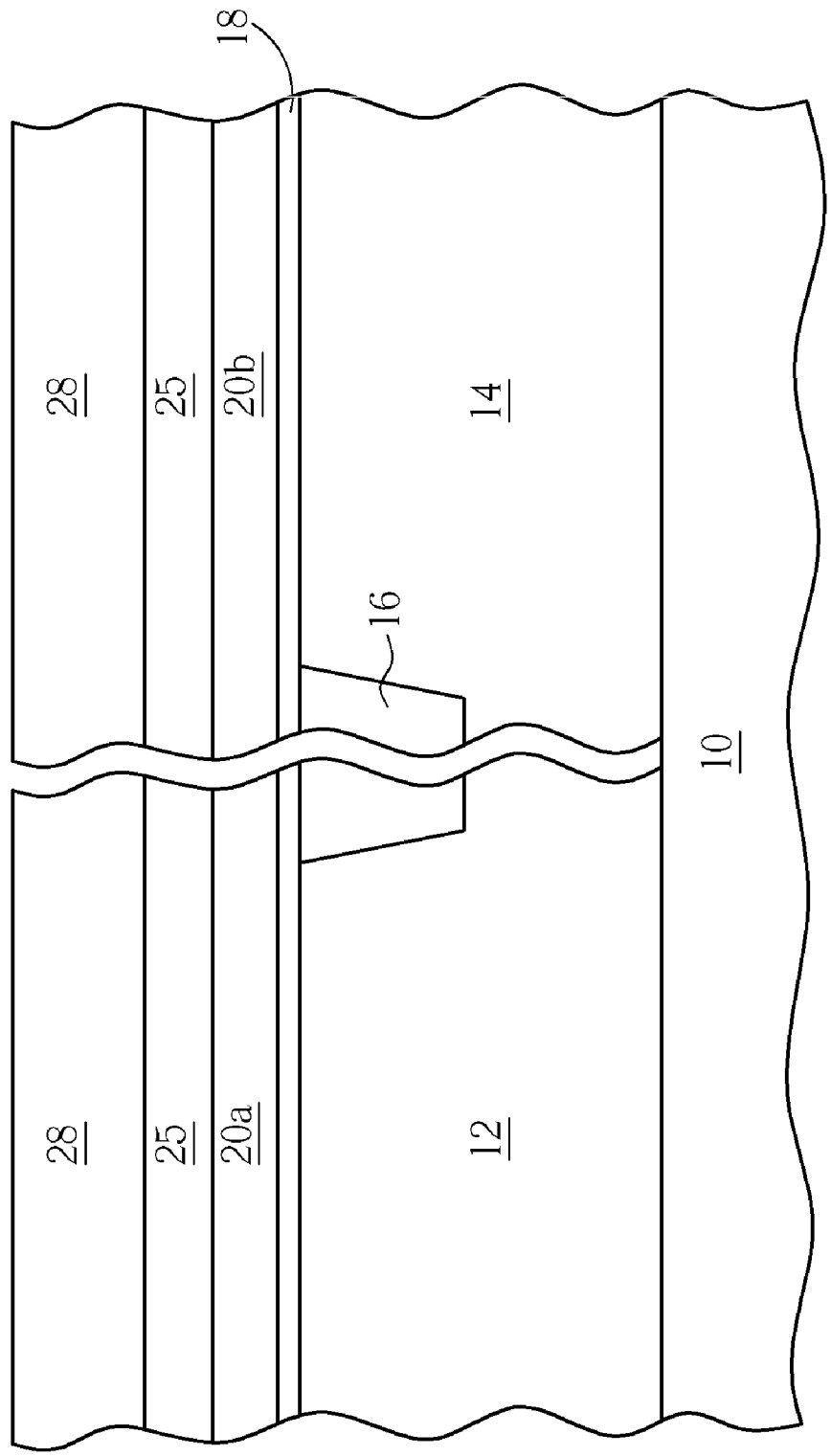

The following steps are the same as in the first embodiment. As shown in FIG. 10, a metal layer 25 is formed on the HfMoN layer 20a, 20b, wherein the metal layer 25 comprises HfN, MoN, TiN, TaN, WN, W, Al, AlN, Pt, Au or any combination thereof. It is worth noting that the metal layer 25 can be omitted optionally according to different product requirements. Then, a dielectric layer 28 is formed on the metal layer 25, wherein the dielectric layer 28 comprises silicon oxide, silicon nitride or any combination thereof. If the metal layer 25 is omitted, the dielectric layer 28 will be positioned on the HfMoN layer 20a, 20b.

Figure 11:
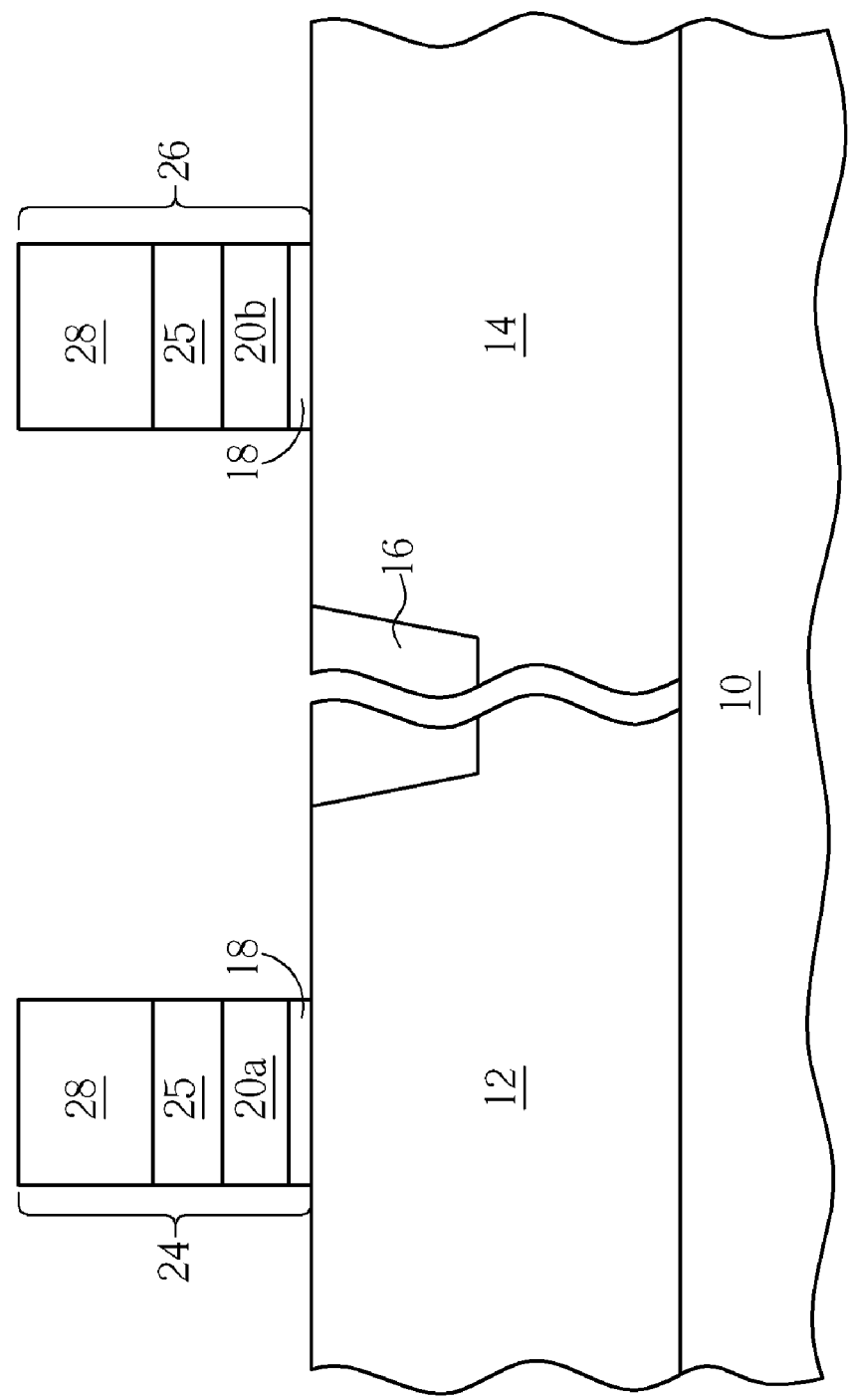
Figure 12:
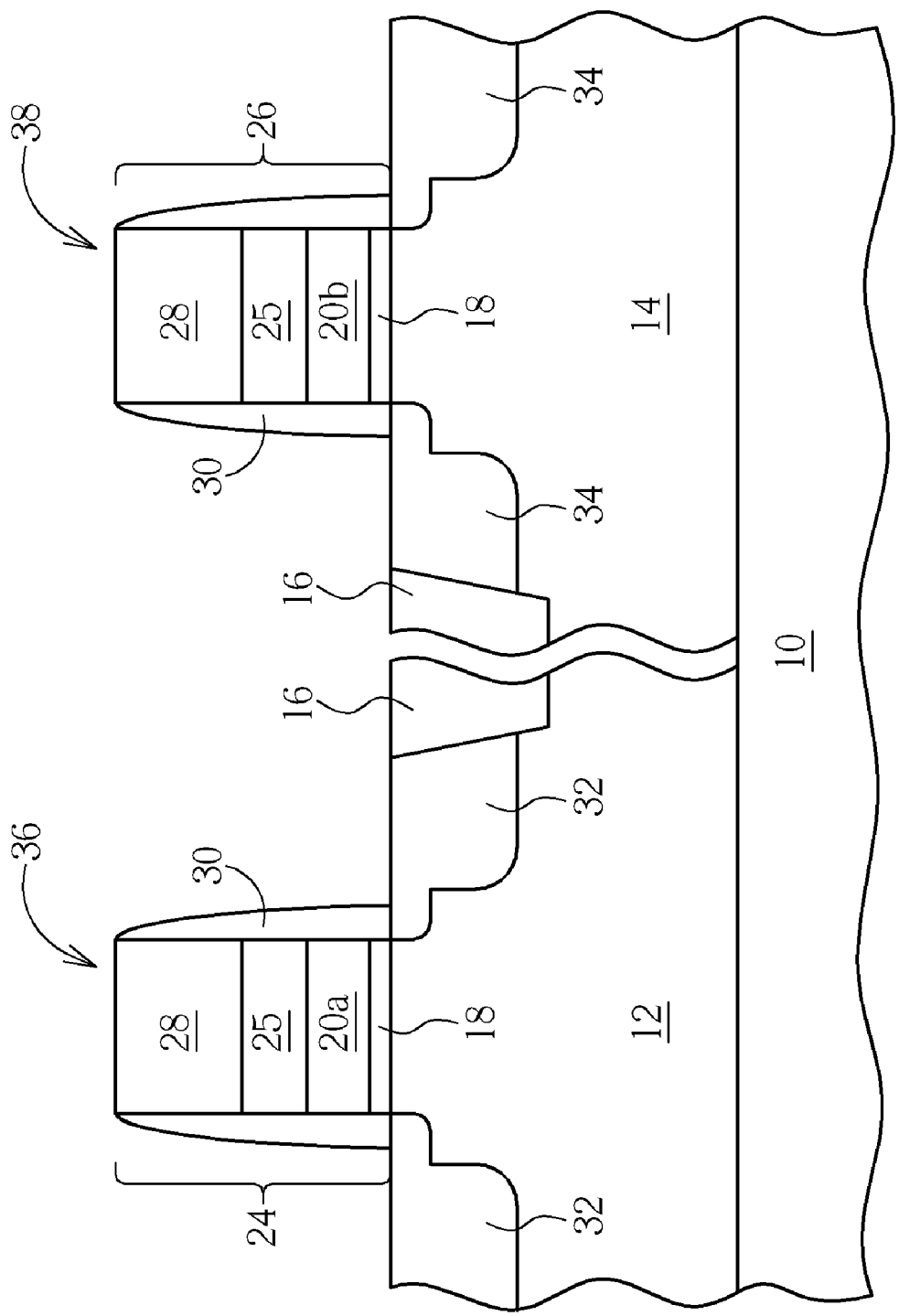

As shown in FIG. 11, a first transistor gate 24 and a second transistor gate 26 are formed. As shown in FIG. 12, a spacer 30 is formed on the sidewall of the first transistor gate 24 and the sidewall of the second transistor gate 26. Then, a first source/drain doping region 32 and a second source/drain doping region 34 are formed in the substrate positioned at two side of the first transistor gate 24 and the second transistor gate 26, respectively. At this point, a first transistor 36 and a second transistor 38 are completely formed. According to a preferred embodiment of the present invention, the first transistor 36 may be a PMOS or NMOS and the second transistor 38 may be a PMOS or NMOS.

Figure 13:
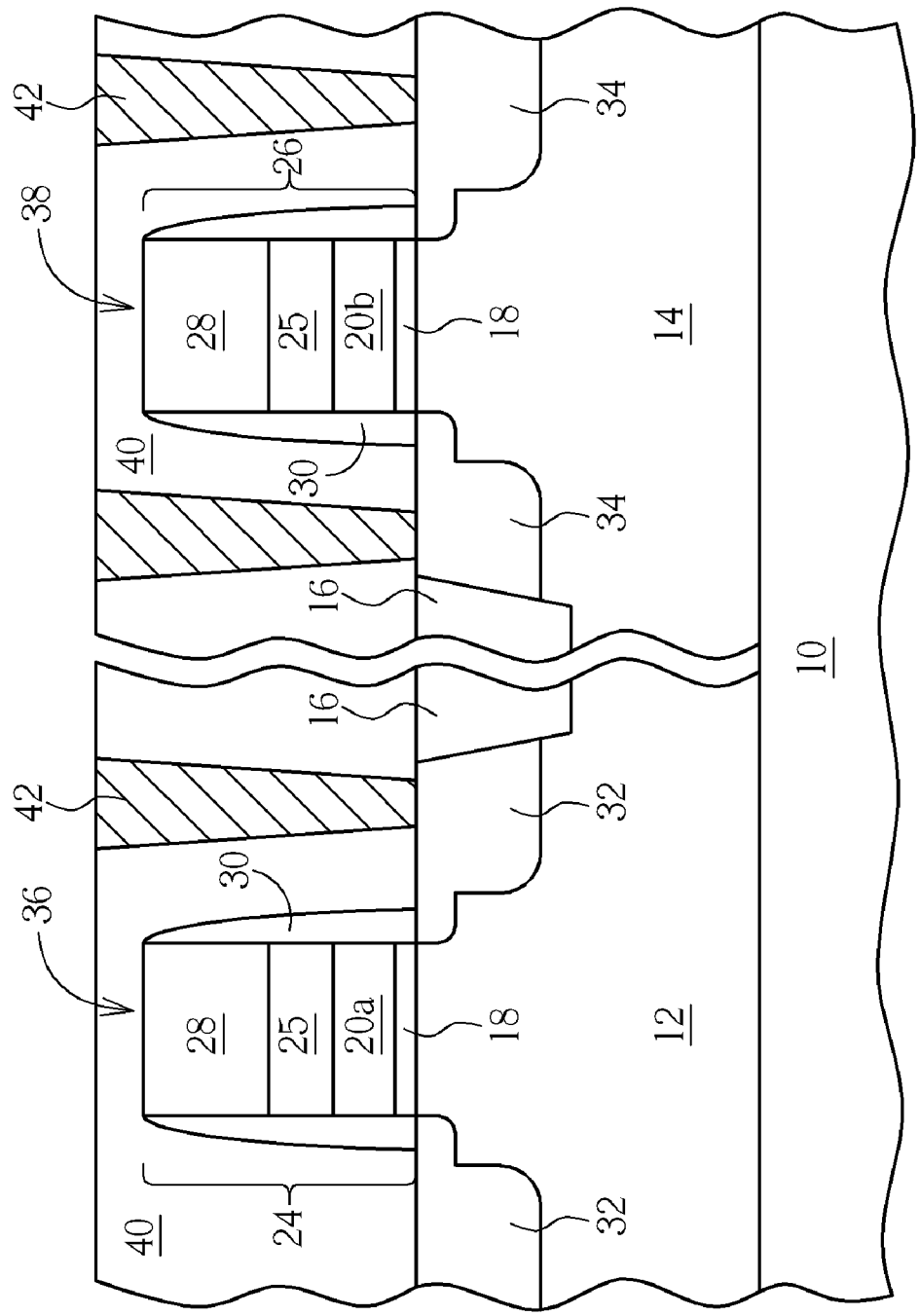

As shown in FIG. 13, an interlayer dielectric layer 40 is formed on the first transistor 36 and the second transistor 38. Next, a plurality of contact holes is formed in the interlayer dielectric layer 40 to partially expose the source/drain doping region 32. Then, a plurality of contact plugs 42 is formed in the contact holes of the interlayer dielectric layer 40. Contact plugs 40 contact the first source/drain doping region 32 and the second source/drain doping region 34 electrically.

A first transistor structure of PMOS, NMOS and CMOS is provided according to a preferred embodiment of the present invention. As shown in FIG. 4, the transistor structure of PMOS, NMOS and CMOS comprises: a substrate 10 comprising a first doping well 12, a second doping well 14 and a STI structure 16. A first transistor 36 and a second transistor 38 are positioned on the surface of the first doping well 12 and the second doping well 14 respectively, wherein the first transistor 36 comprises a first transistor gate 24, a spacer 30 and a first source/drain doping region 32 adjacent to the first transistor gate 24 and wherein the second transistor 38 comprises a second transistor gate 26, a spacer 30 and a second source/drain doping region 24 adjacent to the second transistor gate 26. In addition, the first transistor gate 24 comprises a gate dielectric layer 18 positioned on the surface of the substrate 10, a first metallic compound comprising at least hafnium, molybdenum and nitrogen, such as an HfMoN layer 20a, positioned on the surface of the gate dielectric layer 18, a metal layer 25 positioned on the surface of the HfMoN layer 20a, and a dielectric layer 28 positioned on the surface of the metal layer 25. The second transistor gate 26 comprises the gate dielectric layer 18 positioned on the surface of the substrate 10, a second metallic compound comprising at least hafnium, molybdenum and nitrogen, such as a HfMoN layer 20, positioned on the surface of the gate dielectric layer 18, the metal layer 25 positioned on the surface of the HfMoN layer 20, and the dielectric layer 28 positioned on the surface of the metal layer 25. The HfMoN layer 20 mentioned above may optionally comprise dopant, wherein the dopant may be N, Si, Ge or any combination thereof. The metal layer 25 may be formed optionally according to different requirements.

A second transistor structure of PMOS, NMOS and CMOS according to another preferred embodiment of the present invention is also given. As shown in FIG. 12, the transistor structure of PMOS, NMOS and CMOS comprises: a substrate 10 comprising a first doping well 12, a second doping well 14 and an STI structure 16. A first transistor 36 and a second transistor 38 are positioned on the surface of the first doping well 12 and the second doping well 14 respectively, wherein the first transistor 36 comprises a first transistor gate 24, a spacer 30 and a first source/drain doping region 32 adjacent to the first transistor gate 24 and wherein the second transistor 38 comprises a second transistor gate 26, a spacer 30 and a second source/drain doping region 24 adjacent to the second transistor gate 26. In addition, the first transistor gate 24 comprises a gate dielectric layer 18 positioned on the surface of the substrate 10, a first metallic compound comprising at least hafnium, molybdenum and nitrogen, such as an HfMoN layer 20a, positioned on the surface of the gate dielectric layer 18, a metal layer 25 positioned on the surface of the HfMoN layer 20a, and a dielectric layer 28 positioned on the surface of the metal layer 25. The second transistor gate 26 comprises the gate dielectric layer 18 positioned on the surface of the substrate 10, a second metallic compound comprising at least hafnium, molybdenum and nitrogen, such as an HfMoN layer 20b, positioned on the surface of the gate dielectric layer 18, the metal layer 25 positioned on the surface of the HfMoN layer 20b, and the dielectric layer 28 positioned on the surface of the metal layer 25. The HfMoN layer 20a, 20b mentioned above may comprise dopant such as N, Si or Ge, or any combination thereof. The metal layer 25 may be formed optionally according to different requirements.

The difference between the first and the second transistor structure of the present invention is that: according to the first transistor structure, the HfMoN layer 20a in the first transistor gate 24 is formed by doping the HfMoN layer 20 in order to modulate the work function of the HfMoN layer 20. However, unlike the HfMoN layer 20a, the HfMoN layer 20 in the second transistor gate 26 maintains the original composition instead of being doped.

According to the second transistor structure, both the HfMoN layer 20a in the first transistor gate 24 and the HfMoN layer 20b in the second transistor gate 26 are doped after the HfMoN layer 20 is formed in order to modulate the work function.

It is clear that the conventional method of forming the first gate electrode material layer first followed by etching to form the second gate electrode is both complex and troublesome. The present invention provides a simplified process to form a PMOS or NMOS with different threshold voltage by taking the HfMoN as the gate, and modulating the work function by doping the HfMoN.

Figure 14:
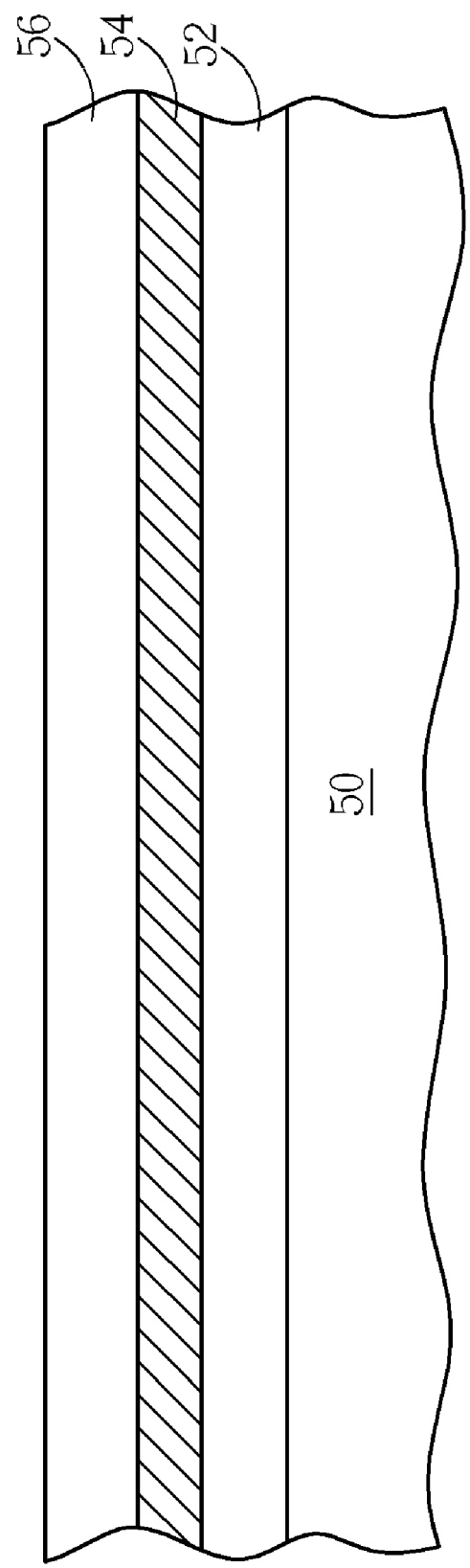
FIG. 14 to FIG. 15 depict a method of making a capacitor structure according the present invention.
Figure 15:
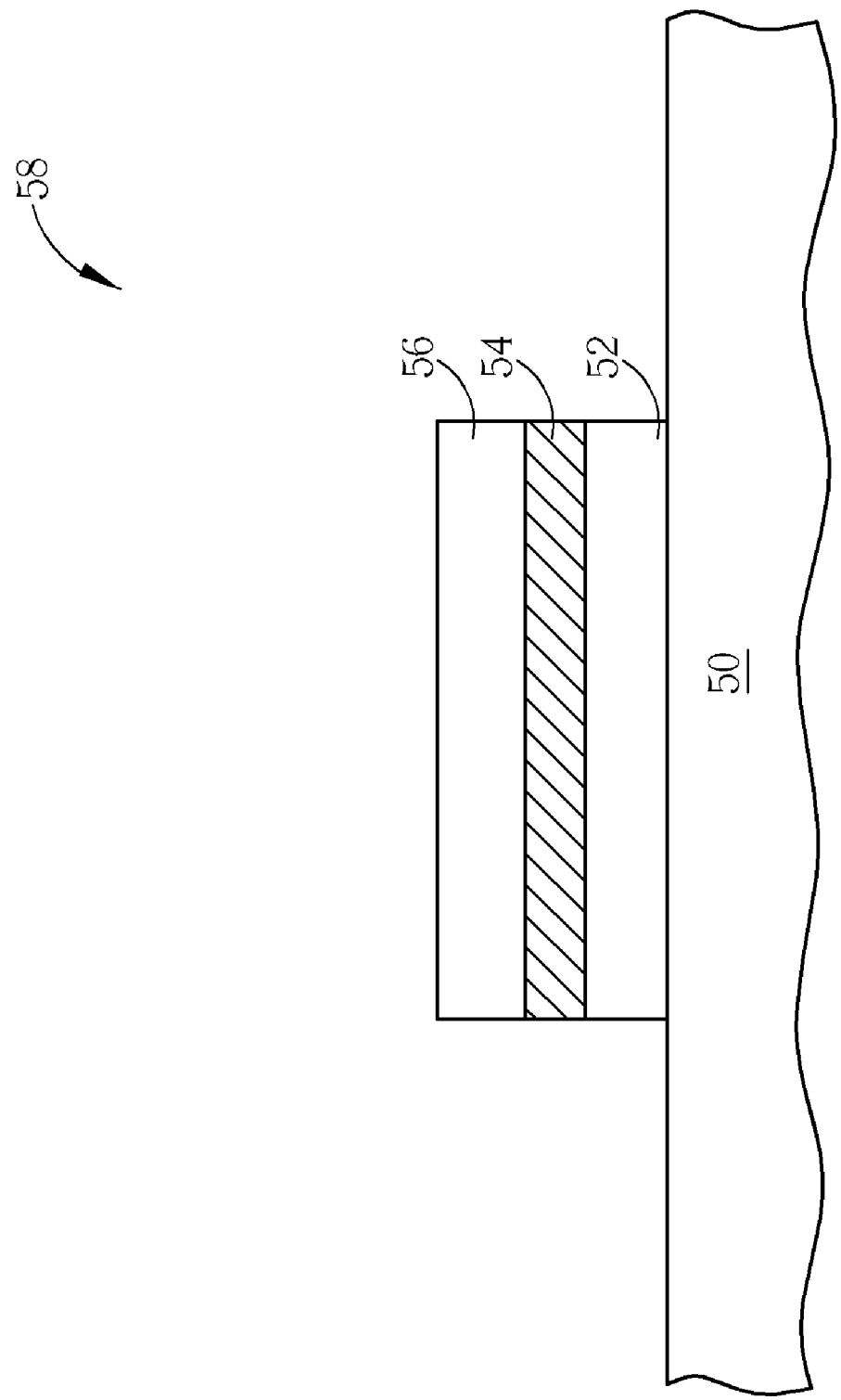

A method of forming a capacitor structure, such as an MIM capacitor is provided in the present invention. FIG. 14 to FIG. 15 depict a method of making a MIM capacitor according to the present invention. As shown in FIG. 14, a substrate 50 is provided. Then, a first metallic compound 52 of a representative formula $Hf_xMo_yN_z$, is formed on the substrate 50. The $x+y+z=1$ and $x\neq 0$, $y\neq 0$, $z\neq 0$. According to a preferred embodiment of the present invention, $x:y=1:1$. The nitrogen content is modulated based on the fabricating temperature and the fabricating pressure of the first metallic compound 52. The method of forming the first metallic compound 52 comprises forming the first metallic compound 52 in a nitrogen-containing environment by a co-sputtering physical vapor deposition process or a chemical vapor deposition process or atomic Layer deposition. According to a preferred embodiment of the present invention, the first metallic compound 52 is formed by the co-sputtering physical vapor deposition process. By taking the Hafnium (Hf) and molybdenum (Mo) as targets, the Hf and Mo targets are bombarded by inert gases such as argon in a nitrogen-containing environment. According to a preferred embodiment of the present invention, the volume flow rate of nitrogen/argon is smaller than 20% (Vol. %). Moreover, the target can be Hf—Mo alloy, and the first metallic compound 52 can be formed by a conventional sputtering process. In addition, the ratio of x and y can be modulated to reach a suitable work function of the first metallic compound 52. According to the preferred embodiment of the present invention, work function of the first metallic compound 52 is between 4.1 ev to 5.2 ev.

Next, a capacitor dielectric layer 54 such as HfSiON is formed on the first metallic compound 52. After that, a second metallic compound 56 of a representative formula $Hf_{x1}Mo_{y1}N_{z1}$ is formed on the capacitor dielectric layer 54 to serve as a top electrode, wherein $x_1+y_1+z_1=1$, $x_1\neq 0$, $y_1\neq 0$, $z_1\neq 0$. According to a preferred embodiment of the present invention, $x_1:y_1=1:1$. The method of forming the second metallic compound 56 is the same as the first metallic compound 52 which is illustrated above, and is therefore omitted here. In addition, the ratio of $x_1$ and $y_1$ can be modulated based on different requirements. According to the preferred embodiment of the present invention, work function of the second metallic compound 56 is between 4.1 ev to 5.2 ev.

As shown in FIG. 15, the pattern of the first metallic compound 52, the capacitor dielectric layer 54 and the second metallic compound 56 is defined by the lithography process and the etching process. At this point, the MIM capacitor 58 of the present invention is finished.

A capacitor structure is provided in the present invention as well. A capacitor structure such as an MIM capacitor 58, includes: a first metallic compound 52 of a representative formula $Hf_xMo_yN_z$ serving as a bottom electrode, a capacitor dielectric layer 54 such as HfSiON positioned on the first metallic compound 52 and a second metallic compound 56 $Hf_{x1}Mo_{y1}N_{z1}$ serving as a top electrode positioned on the capacitor dielectric layer 54, wherein $x_1+y_1+z_1=1$, $x_1\neq 0$, $y_1\neq 0$, $z_1\neq 0$ and $x+y+z=1$, $x\neq 0$, $y\neq 0$, $z\neq 0$. According to the preferred embodiment of the present invention, $x:y=1:1$, and $x_1:y_1=1:1$. Moreover, both work function of the first metallic compound 52 and work function of the second metallic compound 56 are preferably between 4.1 ev to 5.2 ev. The nitrogen content is modulated based on the fabricating temperature and the fabricating pressure of the first metallic compound 52 and the second metallic compound 56.

In addition, another capacitor structure such as an MIS capacitor is provided. The structure of the MIS capacitor and the structure of the MIM capacitor are only different in that the bottom electrode of the MIS capacitor is a silicon substrate and the bottom electrode of the MIM structure is the metallic compound. The remaining parts of the MIS capacitor are the same as the MIM capacitor which is illustrated above, and are omitted here.

Moreover, another capacitor structure such as a trench capacitor is provided in the present invention.

Figure 16:
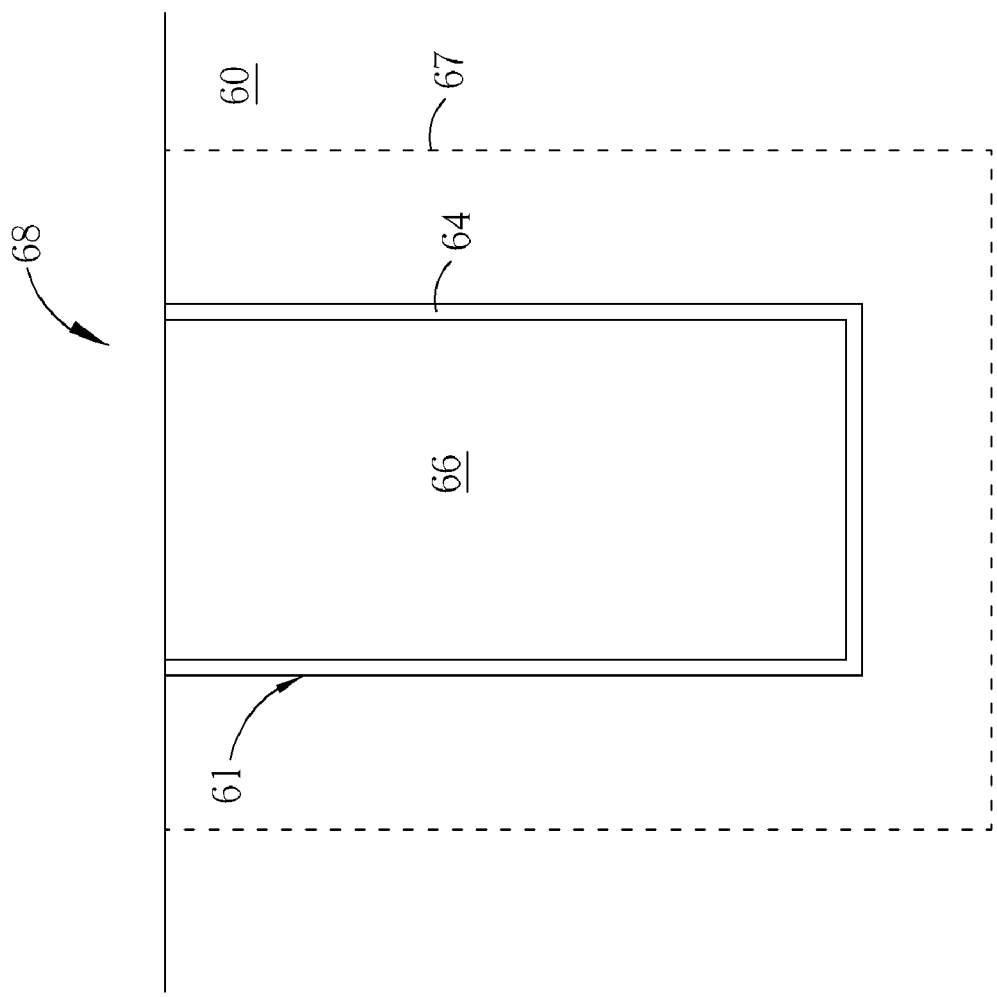
FIG. 16 shows a sectional view of a trench capacitor.

FIG. 16 shows a sectional view of a trench capacitor. As shown in FIG. 16, a trench capacitor 68 includes a substrate 60, such as a semiconductor substrate, and a deep trench 61 positioned in the substrate 60, wherein the deep trench 61 is filled up with a metallic compound 66 of a representative formula $Hf_{x1}Mo_{y1}N_{z1}$, and $x_1+y_1+z_1=1$, $x_1\neq 0$, $y_1\neq 0$, $z_1\neq 0$. The trench capacitor 68 further includes a capacitor dielectric layer 64 such as HfSiON positioned between the substrate 60 and the metallic compound 66 and a diffusion region 67 positioned in the substrate 60 to serve as a bottom electrode. According to the preferred embodiment of the present invention, $x_1:y_1=1:1$ and the work function of the metallic compound 66 is preferably between 4.1 ev to 5.2 ev. The nitrogen content is modulated based on the fabricating temperature and the fabricating pressure of the metallic compound 66.

The present invention features utilizing the $Hf_xMo_yN_z$ or $Hf_{x1}Mo_{y1}N_{z1}$ as an electrode. The capacitor dielectric layer such as HfSiON has a higher homogeneity with the $Hf_xMo_yN_z$ and $Hf_{x1}Mo_{y1}N_{z1}$. Therefore, the affinity between the HfSiON and $Hf_xMo_yN_z$ or $Hf_{x1}Mo_{y1}N_{z1}$ is improved. The peeling problem between the electrode and the capacitor dielectric layer can be avoided in the fabricating process.

Figure 17:
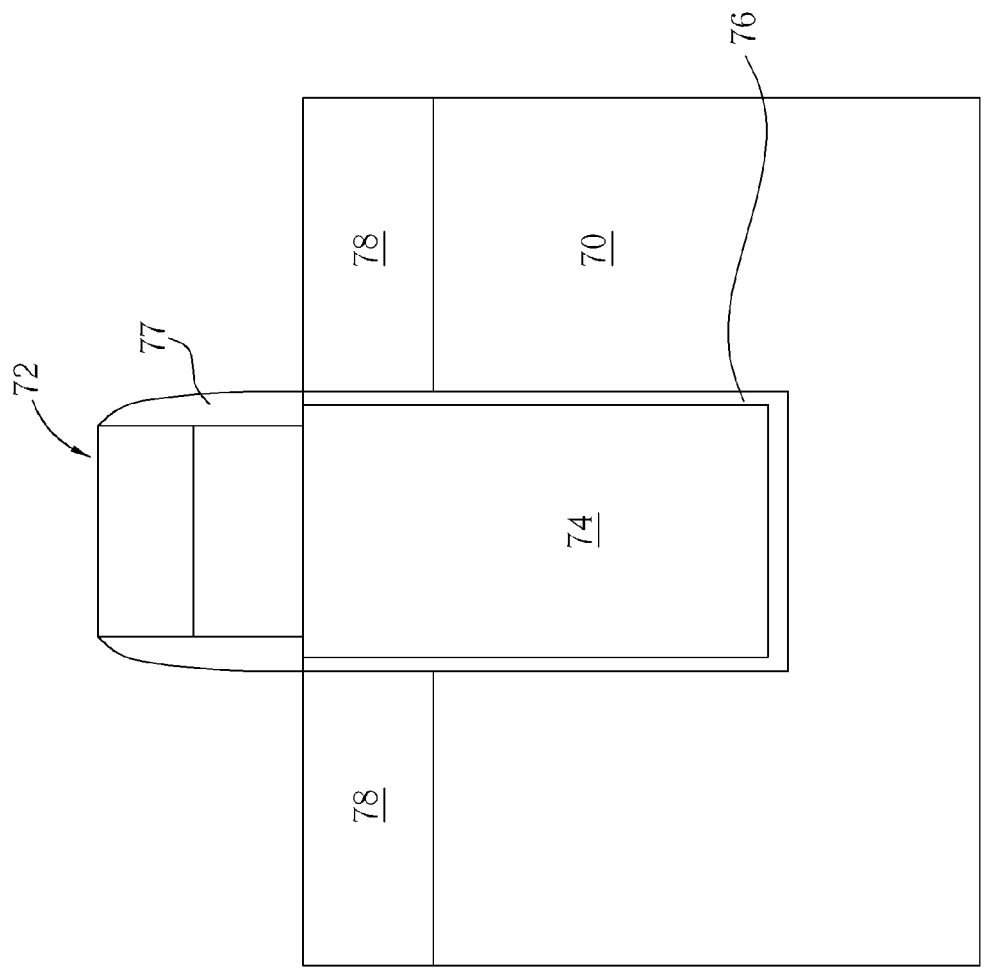
FIG. 17 shows a side view of a recessed-gate MOS transistor of the present invention.

Furthermore, the metallic compound of the present invention can also be utilized in semiconductors with a recessed channel, such as a recessed-gate MOS transistor. FIG. 17 shows side view of a recessed-gate MOS transistor of the present invention. A recessed-gate MOS transistor includes a substrate 70, a recessed-gate conductor 72 positioned on the substrate 70, wherein the recessed-gate conductor 72 includes a metallic compound 74 of a representative formula $Hf_xMo_yN_z$, a gate dielectric layer 76 positioned between the recessed-gate conductor 72 and the substrate 70, a spacer 77 positioned at two sides of the recessed-gate conductor 72 and a source/drain doping region 78 positioned in the substrate 70 at two sides of the recessed-gate conductor 72, wherein $x+y+z=1$, $x\neq 0$, $y\neq 0$, $z\neq 0$.

Figure 18:
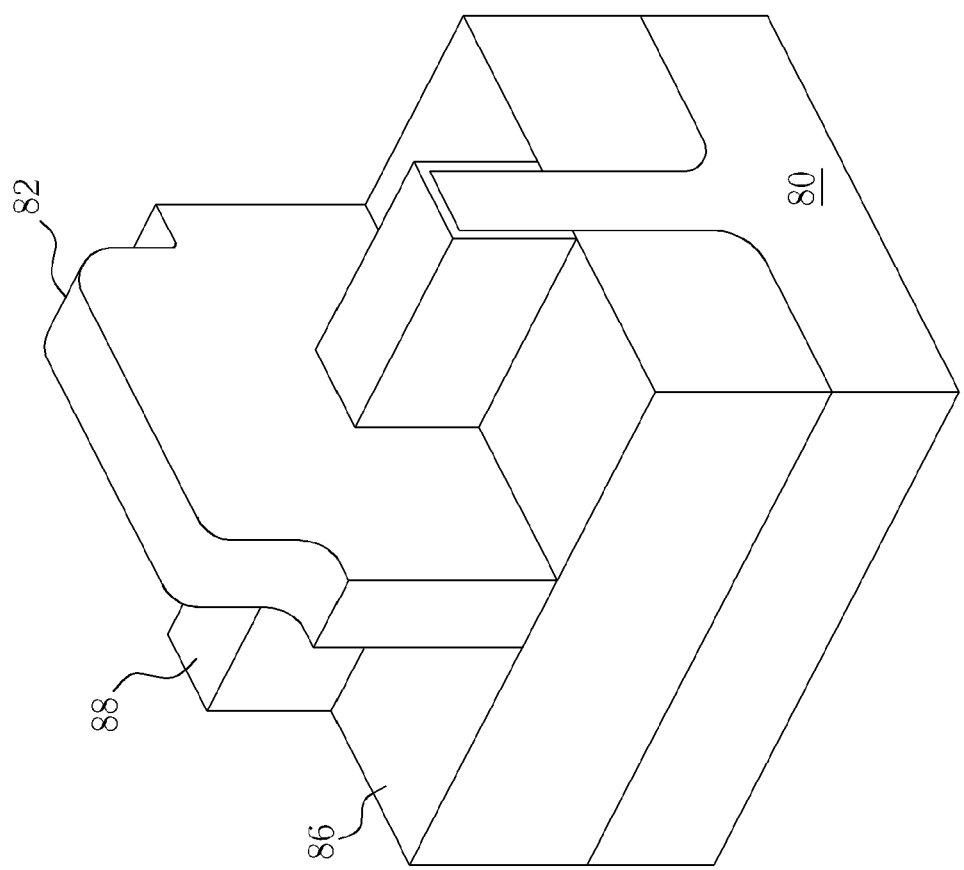
FIG. 18 shows a side view of a FinFET transistor of the present invention.

Moreover, the metallic compound of the present invention, can also be utilized in FinFET transistors. FIG. 18 shows a side view of a FinFET transistor of the present invention. The FinFET transistor includes a substrate 80, a fin structure 82 positioned on the substrate 80, wherein the fin structure 82 includes a metallic compound of a representative formula HfxMoyNz, a gate dielectric layer (not shown) positioned between the substrate 80 and the fin structure 82, an insulator 86 positioned in the substrate 80 and a source/drain doping region 88 positioned in the substrate 80 at two side of the fin structure 82, wherein $x+y+z=1$, $x\neq 0$, $y\neq 0$, $z\neq 0$.

Those skilled in the art will readily observe that numerous modifications and alterations of the device and method may be made while retaining the teachings of the invention.

What is claimed is:

1. A capacitor structure, comprising:
   a bottom electrode comprising a conductive material;
   a capacitor dielectric layer positioned on the bottom electrode; and
   a top electrode positioned on the capacitor dielectric layer and having a first metallic compound $Hf_{x1}Mo_{y1}N_{z1}$, where $x_1+y_1+z_1=1$, $x_1\neq 0$, $y_1\neq 0$, $z_1\neq 0$.

2. The capacitor structure of claim 1, wherein the conductive material has a second metallic compound $Hf_xMo_yN_z$, and $x+y+z=1$, $x\neq 0$, $y\neq 0$, $z\neq 0$.

3. The capacitor structure of claim 2, wherein $x:y=1:1$.

4. The capacitor structure of claim 2, wherein work function of the second metallic compound is between 4.1 ev to 5.2 ev.

5. The capacitor structure of claim 1, wherein $x_1 : y_1 = 1:1$.

6. The capacitor structure of claim 1, wherein work function of the first metallic compound is between 4.1 ev to 5.2 ev.

7. The capacitor structure of claim 1, wherein the conductive material is silicon.

8. A capacitor structure comprising:
a substrate;
a deep trench positioned in the substrate, wherein the deep trench is filled up with a metallic compound $Hf_{x1}Mo_{y1}N_{z1}$, wherein $x_1+y_1+z_1=1$, $x_1 \neq 0$, $y_1 \neq 0$, $z_1 \neq 0$; and
a capacitor dielectric layer positioned between the substrate and the metallic compound.

9. The capacitor structure of claim 8, wherein $x_1 : y_1 = 1:1$.

10. The capacitor structure of claim 8, wherein work function of the metallic compound is between 4.1 ev to 5.2 ev.

11. The capacitor structure of claim 8 further comprising a diffusion region positioned in the substrate to serve as a bottom electrode.

12. A method of forming a capacitor structure, comprising:
providing a substrate;
forming a first metallic compound on the substrate, wherein the first metallic compound is $Hf_xMo_yN_z$, and $x+y+z=1$, $x \neq 0$, $y \neq 0$, $z \neq 0$;
forming a capacitor dielectric layer on the first metallic compound;
forming a second metallic compound on the capacitor dielectric layer, wherein the second metallic compound is $Hf_{x1}Mo_{y1}N_{z1}$, and $x_1+y_1+z_1=1$, $x_1 \neq 0$, $y_1 \neq 0$, $z_1 \neq 0$; and
defining pattern of the first metallic compound, the capacitor dielectric layer and the second metallic compound to form the capacitor structure.

13. The method of claim 12, wherein the method of forming the first metallic compound and the second metallic compound is selected from the group consisting of co-sputtering physical vapor deposition, atomic Layer deposition and chemical vapor deposition.

14. The method of claim 12, wherein $x : y = 1:1$.

15. The method of claim 12, wherein $x_1 : y_1 = 1:1$.

16. A metallic compound of a representative formula $Hf_xMo_yN_z$, wherein $x+y+z=1$, $x \neq 0$, $y \neq 0$, $z \neq 0$.

17. A metallic compound of claim 16, wherein $x : y = 1:1$.

18. A capacitor structure, comprising:
a bottom electrode comprising a conductive material;
a capacitor dielectric layer made of HfSiON positioned on the bottom electrode; and
a top electrode positioned on the capacitor dielectric layer and having a first metallic compound $Hf_{x1}Mo_{y1}N_{z1}$, where $x_1+y_1+z_1=1$, $x_1 \neq 0$, $y_1 \neq 0$, $z_1 \neq 0$.

19. A capacitor structure comprising:
a substrate;
a deep trench positioned in the substrate, wherein the deep trench is filled up with a metallic compound $Hf_{x1}Mo_{y1}N_{z1}$, wherein $x_1+y_1+z_1=1$, $x_1 \neq 0$, $y_1 \neq 0$, $z_1 \neq 0$; and
a capacitor dielectric layer made of HfSiON positioned between the substrate and the metallic compound.

20. A method of forming a capacitor structure, comprising:
providing a substrate;
forming a first metallic compound on the substrate, wherein the first metallic compound is $Hf_xMo_yN_z$, and $x+y+z=1$, $x \neq 0$, $y \neq 0$, $z \neq 0$;
forming a capacitor dielectric layer made of HfSiON on the first metallic compound;
forming a second metallic compound on the capacitor dielectric layer, wherein the second metallic compound is $Hf_{x1}Mo_{y1}N_{z1}$, and $x_1+y_1+z_1=1$, $x_1 \neq 0$, $y_1 \neq 0$, $z_1 \neq 0$; and
defining pattern of the first metallic compound, the capacitor dielectric layer and the second metallic compound to form the capacitor structure.

* * * * *